United States Patent
Agrawal et al.

(10) Patent No.: US 11,886,401 B2
(45) Date of Patent: *Jan. 30, 2024

(54) DATABASE KEY COMPRESSION

(71) Applicant: salesforce.com, inc., San Francisco, CA (US)

(72) Inventors: Rohit Agrawal, San Francisco, CA (US); Aditya Dharmanand Shetty, San Francisco, CA (US); Thomas Fanghaenel, Oakland, CA (US)

(73) Assignee: Salesforce, Inc., San Francisco, CA (US)

( * ) Notice: Subject to any disclaimer, the term of this patent is extended or adjusted under 35 U.S.C. 154(b) by 64 days.

This patent is subject to a terminal disclaimer.

(21) Appl. No.: 17/647,570

(22) Filed: Jan. 10, 2022

(65) Prior Publication Data
US 2022/0129428 A1 Apr. 28, 2022

Related U.S. Application Data

(63) Continuation of application No. 16/457,842, filed on Jun. 28, 2019, now Pat. No. 11,221,999.

(51) Int. Cl.
| | |
|---|---|
| *G06F 16/00* | (2019.01) |
| *G06F 16/215* | (2019.01) |
| *H03M 7/30* | (2006.01) |
| *G06F 16/22* | (2019.01) |

(52) U.S. Cl.
CPC ........ *G06F 16/215* (2019.01); *G06F 16/2246* (2019.01); *G06F 16/2272* (2019.01); *H03M 7/30* (2013.01)

(58) Field of Classification Search
None
See application file for complete search history.

(56) References Cited

U.S. PATENT DOCUMENTS

| | | | |
|---|---|---|---|
| 7,647,291 B2 | 1/2010 | Mosescu | |
| 10,552,443 B1 * | 2/2020 | Wu | G06F 16/258 |
| 2005/0007845 A1 * | 1/2005 | Angerer | H03M 7/30 365/202 |
| 2005/0065890 A1 * | 3/2005 | Benaloh | G11B 20/0021 705/51 |
| 2005/0165850 A1 * | 7/2005 | Mosescu | G06F 16/2246 |
| 2005/0192941 A1 | 9/2005 | Biedenstein et al. | |
| 2008/0104149 A1 | 5/2008 | Vishniac et al. | |
| 2008/0307044 A1 * | 12/2008 | Musson | H03M 7/30 709/203 |
| 2009/0248725 A1 * | 10/2009 | Bhattacharjee | H03M 7/30 |

(Continued)

*Primary Examiner* — Hasanul Mobin
(74) *Attorney, Agent, or Firm* — Kowert, Hood, Munyon, Rankin & Goetzel, P.C.; Mark D. Seegers; Dean M. Munyon

(57) ABSTRACT

Techniques are disclosed relating to compressing database keys. A computer system may receive a request to write a database record to a storage medium. The database record may include a database key and a corresponding data value. The computer system may compress the database key by replacing a portion of the database key with particular data that identifies a location of a reference database key and an amount of similarity determined between the database key and the reference database key. The computer system may write the database record to the storage medium. The database record may include the compressed database key and the corresponding data value.

20 Claims, 8 Drawing Sheets

(56) References Cited

U.S. PATENT DOCUMENTS

| | | | |
|---|---|---|---|
| 2009/0287706 A1* | 11/2009 | Bourges-Waldegg | ....................... G06F 21/6209 707/999.009 |
| 2011/0029498 A1* | 2/2011 | Ferguson | ............ G06F 16/2343 707/703 |
| 2014/0188900 A1* | 7/2014 | Sankaran | ............ H03M 7/3084 707/749 |
| 2016/0012090 A1* | 1/2016 | Sacco | ..................... G06F 16/40 707/742 |
| 2016/0364402 A1 | 12/2016 | Velury et al. | |
| 2017/0116280 A1* | 4/2017 | Shergill, Jr. | ......... G06F 16/2272 |
| 2017/0322971 A1* | 11/2017 | Seshadri | ............... G06F 16/214 |
| 2018/0293280 A1* | 10/2018 | Svec | ..................... G06F 16/289 |
| 2020/0183906 A1* | 6/2020 | Spillane | .................. G06F 16/86 |
| 2020/0285619 A1* | 9/2020 | Teyer | ................... G06F 16/2282 |
| 2022/0129428 A1* | 4/2022 | Agrawal | ............... G06F 16/215 |

\* cited by examiner

DATABASE KEY COMPRESSION

RELATED APPLICATION

The present application is a continuation of U.S. application Ser. No. 16/457,842, filed Jun. 28, 2019, which is incorporated by reference herein in its entirety.

BACKGROUND

Technical Field

This disclosure relates generally to database key compression.

Description of the Related Art

Companies typically rely on large database systems to manage their information. These large database systems store a collection of information in an organized format that allows for the information to be efficiently accessed, managed, and updated. Such database systems often store information under database tables composed of columns and rows in which each column defines a database attribute/field that corresponds to a grouping of the information. Each row of information in a table can be identified by a unique key, which may specify a unique value for a particular attribute of the table that stores unique values. For example, a table that includes database records for students may include a student ID field. The student ID of a given student (plus additional information such as identifier for the table) can be used to locate their database record within the table. Accordingly, when accessing and/or updating a database record in the database, a database system may use a key to identify the database record from multiple records in the database.

Figure 1:
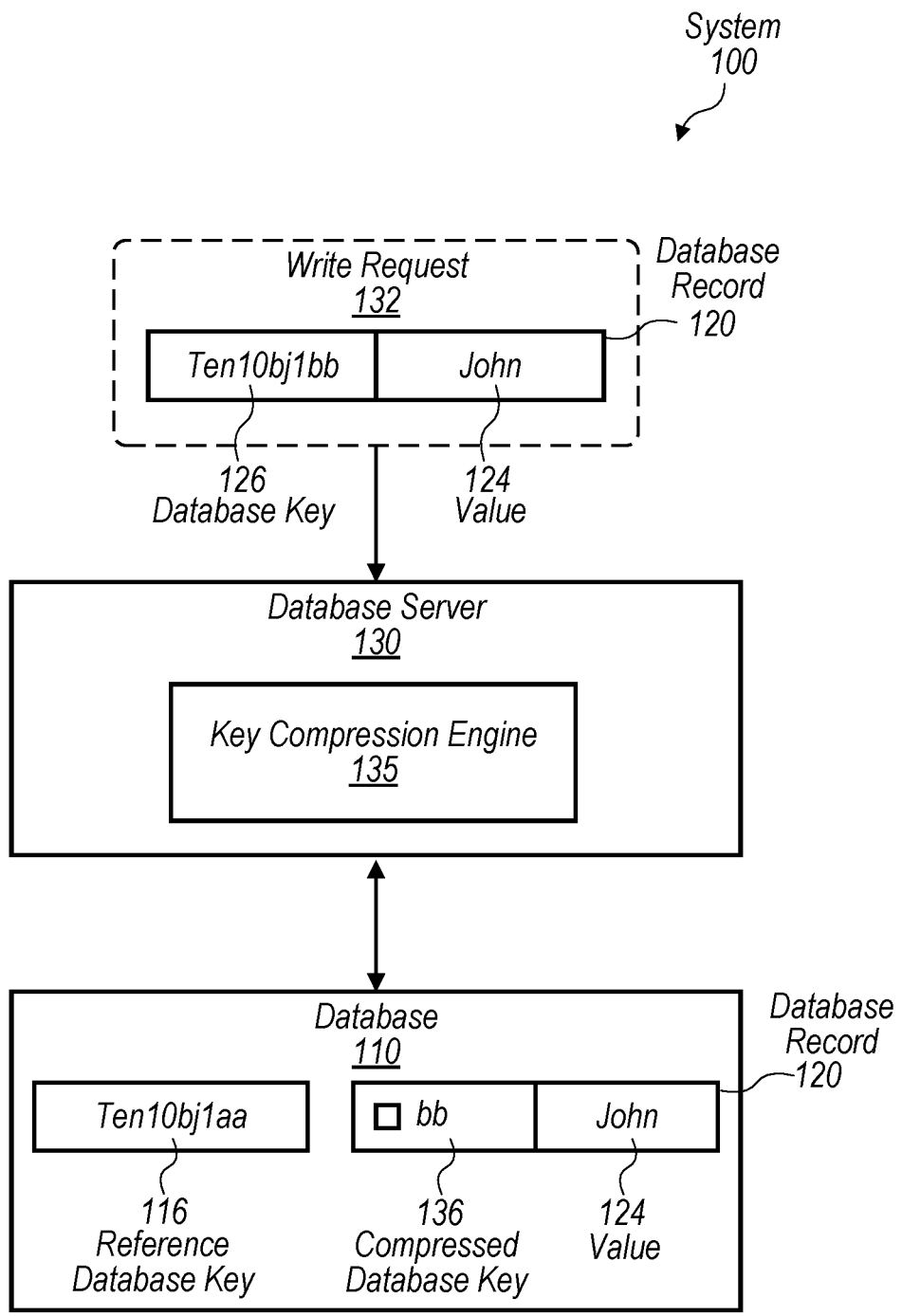
FIG. 1 is a block diagram illustrating example elements of a system that is capable of compressing and decompressing database keys, according to some embodiments.

This disclosure includes references to "one embodiment" or "an embodiment." The appearances of the phrases "in one embodiment" or "in an embodiment" do not necessarily refer to the same embodiment. Particular features, structures, or characteristics may be combined in any suitable manner consistent with this disclosure.

Within this disclosure, different entities (which may variously be referred to as "units," "circuits," other components, etc.) may be described or claimed as "configured" to perform one or more tasks or operations. This formulation—[entity] configured to [perform one or more tasks]—is used herein to refer to structure (i.e., something physical, such as an electronic circuit). More specifically, this formulation is used to indicate that this structure is arranged to perform the one or more tasks during operation. A structure can be said to be "configured to" perform some task even if the structure is not currently being operated. A "network interface configured to communicate over a network" is intended to cover, for example, an integrated circuit that has circuitry that performs this function during operation, even if the integrated circuit in question is not currently being used (e.g., a power supply is not connected to it). Thus, an entity described or recited as "configured to" perform some task refers to something physical, such as a device, circuit, memory storing program instructions executable to implement the task, etc. This phrase is not used herein to refer to something intangible. Thus, the "configured to" construct is not used herein to refer to a software entity such as an application programming interface (API).

The term "configured to" is not intended to mean "configurable to." An unprogrammed FPGA, for example, would not be considered to be "configured to" perform some specific function, although it may be "configurable to" perform that function and may be "configured to" perform the function after programming.

Reciting in the appended claims that a structure is "configured to" perform one or more tasks is expressly intended not to invoke 35 U.S.C. § 112(f) for that claim element. Accordingly, none of the claims in this application as filed are intended to be interpreted as having means-plus-function elements. Should Applicant wish to invoke Section 112(f) during prosecution, it will recite claim elements using the "means for" [performing a function] construct.

As used herein, the terms "first," "second," etc. are used as labels for nouns that they precede, and do not imply any type of ordering (e.g., spatial, temporal, logical, etc.) unless specifically stated. For example, in an index block that has multiple keys, the terms "first" key and "second" key can be used to refer to any key of the index block. In other words, the first and second keys are not limited to the initial two keys of the index block.

As used herein, the term "based on" is used to describe one or more factors that affect a determination. This term does not foreclose the possibility that additional factors may affect a determination. That is, a determination may be solely based on specified factors or based on the specified factors as well as other, unspecified factors. Consider the phrase "determine A based on B." This phrase specifies that B is a factor is used to determine A or that affects the determination of A. This phrase does not foreclose that the determination of A may also be based on some other factor, such as C. This phrase is also intended to cover an embodiment in which A is determined based solely on B. As used herein, the phrase "based on" is thus synonymous with the phrase "based at least in part on."

DETAILED DESCRIPTION

One concern of any enterprise database is the on-disk storage footprint. In many cases, a database system may write database records to a database, where the database records include a key (which may identify a row in a table) and a corresponding data value (which may be row data). In some implementations, a large percentage of the storage footprint of a database comes from the keys of the database records stored in the database. It may thus be desirable to reduce the storage footprint caused by database keys.

The present disclosure describes various techniques for compressing database keys. In various embodiments that are described below, a computer system receives a request to write a database record to a database. Such a database record may include a database key and a data value (which may be data for various fields in a table). In various embodiments, the computer system accesses a reference database key (corresponding to the database key) and compresses the database key based on the reference database key. In some cases, compressing the database key may involve replacing a portion of the database key with data that identifies a location of the reference database key and an amount of similarity between the database key and the reference database key. Thereafter, the computer system may write the database record to the database, where the database record includes the compressed database key and the data value. In various embodiments, the computer system decompresses compressed database keys. To decompress a compressed database key, the computer system accesses the reference database key from the location identified by the data of the compressed database key. The computer system may then replace the data of the compressed database key with a portion of the reference database key that is identified from the amount of similarity between the reference database key and the original uncompressed version of that database key.

The computer system may further receive requests to locate a database record within a database. Such requests may specify a search key that identifies the database record. In various embodiments, the computer system determines a reference database key corresponding to the search key. This may include selecting the reference database key (from a group of keys) that has the greatest similarity with the search key while being less in value than the search key. In various cases, the computer system may then compress the search key based on the determined reference database key. The computer system may search for the relevant database record by walking through a set of database records while comparing the compressed search key against the compressed database keys of those database records. If the database record is located, then the computer system may return that database record to the requestor.

These techniques may be advantageous over prior approaches as these techniques allow the storage footprint caused by database keys to be significantly reduced by compressing those database keys. Moreover, these techniques can compress database keys in such a manner that the key-sorted order of compressed keys matches the key-sorted order of those keys when they are decompressed. This may be advantageous in database systems that implement a log-structured merge-tree (LSM tree) that requires database records within a level of the LSM tree to be written in key-sorted order. An example system for implementing these techniques will now be discussed below, starting with FIG. 1.

Turning now to FIG. 1, a block diagram of a system 100 is shown. System 100 is a set of components that are implemented via hardware or a combination of hardware and software routines. In the illustrated embodiment, system 100 includes a database 110 and a database server 130. As depicted, database 110 includes a reference database key 116 and a database record 120, and database server 130 includes key compression engine 135. In some embodiments, system 100 may be implemented differently than shown. For example, system 100 may include more than one database 110 and/or database server 130.

Database 110, in various embodiments, is a collection of information that is organized in a manner that allows for access, storage, and manipulation of that information. Accordingly, database 110 may include supporting software that allows for database server 130 to perform operations (e.g., accessing, storing, etc.) on information in database 110. Database 110 may be implemented by a single storage device or multiple storage devices that are connected together on a network (e.g., a storage attached network) and configured to redundantly store information in order to prevent data loss.

In various embodiments, database 110 is a key-value database that stores information as a collection of key-value pairs in which a key serves as a unique identifier. Accordingly, as shown, database 110 can store database records 120 that include a value 124 and a compressed database key 136 (or its uncompressed form, database key 126). Value 124 may be any suitable information that a user wishes to store such as a single data point (e.g., a name) or a collection of data points (e.g., a name, an age, and a phone number). Accordingly, value 124 may specify a row of data for a database table. Database key 126 and compressed database key 136 may be any suitable information that can be used to identify a corresponding database record 120. As an example, database key 126 may specify a table identifier and a row identifier corresponding to a particular database record 120 in a particular database table. When accessing or updating a database record 120 within database 110, a database key 126 or a compressed database key 136 may be used to identify that database record from multiple database records 120.

In some embodiments, database 110 is implemented using a log-structured merge-tree (LSM tree) having multiple levels. One or more of the levels may include database records 120 that are cached in an in-memory buffer before being written to the levels maintained on an on-disk storage medium. When a batch of database records 120 is written to a file on the on-disk storage medium, those records are written in key-stored order within the file in order to comply with the LSM tree design. Accordingly, as discussed further below, database server 130 may compress database keys 126 in such a way that a set of compressed database keys 136 has the same key-sorted ordering as the uncompressed version of the keys. An example database 110 is discussed in greater detail with respect to FIG. 2.

Database server 130, in various embodiments, performs various operations to manage database 110, including data storage, data retrieval, and data manipulation. In various embodiments, database server 130 provides database services to other systems that wish to interact with database 110. Such database services may include accessing and/or storing database records 120 in database 110 on behalf of those other systems. As an example, an application server may issue a write request 132 to database server 130 for writing a particular database record 120 to database 110. As shown for example, write request 132 may specify a database record 120 having a value 124 "John" and a database key 126 "Ten10bj1bb." When writing a database record 120, database server 130 invokes key compression engine 135 to compress the database key 126 of that database record.

Key compression engine 135, in various embodiments, compresses database keys 126 and decompresses compressed database keys 136. When compressing or decompressing, key compression engine 135 selects a reference database key 116. A given reference database key 116, in various embodiments, is a database key 126 based upon which other database keys 126 are compressed and then subsequently decompressed. In various cases, when compressing a database key 126, key compression engine 135 may select, from multiple reference database keys 116, the reference database key 116 that is the most similar to the database key 126 that is being compressed. For example, reference database key 116 "Ten10bj1aa" may be selected over a reference database key 116 "123abcj1cc" (not shown) when compressing database key 126 "Ten10bj1bb."

After selecting a reference database key 116, in various embodiments, key compression engine 135 compresses a database key 126 (or decompresses a compressed database key 136) based on the selected reference database key 116. Key compression engine 135 may compress a database key 126 by replacing a portion of the database key with data that identifies a location of the corresponding reference database key 116 and identifies an amount of similarity between the database key 126 and the reference database key 116. As illustrated in FIG. 1 for example, database key 126 "Ten10bj1bb" compresses to compressed database key 136 "□bb."

Note that a square ("□") is shown for illustrative purposes. As explained further below, in some embodiments, the data that replaces a portion of a database key 126 is 32-bits of data, 10 bits of which may identify an index block, 12 bits of which may identify a slot offset in that index block, and 10 bits of which may identify the number of shared bytes between database key 126 and the corresponding reference database key 116. In other embodiments, more or less bits may be used than 32 bits.

Key compression engine 135 may decompress a compressed database key 136 by replacing the data (which was added during compression) with the original, replaced portion of the uncompressed version (i.e., database key 126) of that compressed database key 136. To that end, key compression engine 135 may access the appropriate reference database key 116 based on the location identified by the compressed database key 136. Key compression engine 135 may then replace the data with a portion of the reference database key 116 based on the identified similarity. An example of key compression is discussed in greater detail with respect to FIGS. 3A and 3B.

Accordingly, when reading or writing database records 120 to database 110, database server 130 may implement key compression engine 135 to compress database keys 126 and to decompress compressed database keys 136. By compressing database keys 126 before writing database records 120 to database 110, database server 130 may significantly reduce the storage footprint caused by database keys 126. An example database server 130 is discussed in greater detail with respect to FIG. 4.

Figure 2:
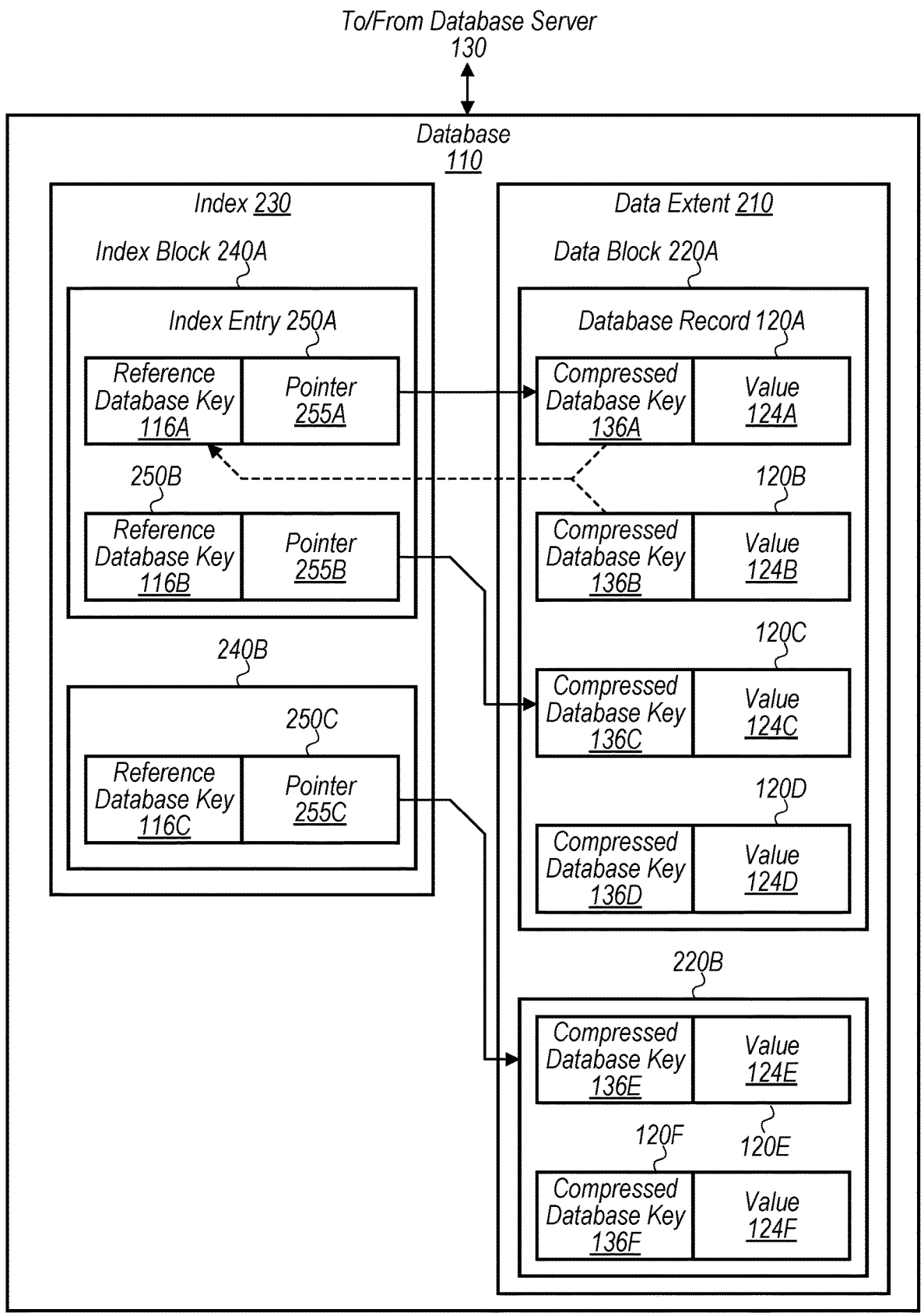
FIG. 2 is a block diagram illustrating example elements of a database that is capable of storing database records having compressed database keys, according to some embodiments.

Turning now to FIG. 2, a block diagram of an example database 110 is shown. In the illustrated embodiment, database 110 includes a data extent 210 and an index 230. As depicted, data extent 210 includes a data block 220A having database records 120A-D and a data block 220B having database records 120E and 120F. Database records 120A-F include compressed database keys 136A-F and values 124A-F, respectively. Also as illustrated, index 230 includes an index block 250A having index entries 250A and 250B, and an index block 240B having an index entry 250C. Index entries 250A-C include reference database keys 116A-C and pointers 255A-C, respectively. In some embodiments, database 110 may be implemented differently than shown. For example, index 230 may correspond to multiple data extents 210 of database 110.

Data extent 210, in various embodiments, is a logical unit of storage comprising one or more contiguous data blocks 220. A data block 220, in various embodiments, corresponds to a specific number of bytes of physical database space on a storage medium. Accordingly, a data extent 210 may be considered the next level in a hierarchy of logical database space in relation to data blocks 220. In some cases, a set of data extents 210 may make up a data segment and a set of data segments may make up a tablespace. In various embodiments, database server 130 allocates a data block 220 in data extent 210 and writes database records 120 to that data block 220. After that data block 220 is full, database server 130 may allocate additional data blocks 220 in data extent 210 for storing additional database records 120.

In some embodiments, database records 120 may be written in key-sorted order within data extent 210. This is performed in some cases because the implementation of the LSM tree may require that data extents maintain keys in key-sorted order. Accordingly, when writing out database records 120 that have compressed database keys 136, those database records 120 may be written in key-sorted order according to the values of their compressed database keys 136. Consider an example in which compressed database key 136A has a value of "aaaa" and compressed database key 136B has a value of "bbbb." As such, database record 120A (which includes compressed database key 136A) may be stored logically before database record 120B (which includes compressed database key 136B). As illustrated, database record 120A is stored logically before database record 120B in data block 220A.

Index 230, in various embodiments, is a data structure that allows for database records 120 to be located in a more efficient manner. As illustrated, index 230 comprises index blocks 240, which may be similar in nature to data blocks 220A except that index blocks 240 are part of an index and may not store database records 120. An index block 240 may include a set of index entries 250. An index entry 250, in various embodiments, includes a reference database key 116 and a pointer 255. A pointer 255, in various embodiments, is information that identifies the location of the database record 120 corresponding to the reference database key 116 that is associated with that pointer. Accordingly, a pointer 255 may specify a data block 220 and an offset in that data block corresponding to a database record 120. As an example, pointer 255B (which points to database record 120C) may specify data block 220A and the third slot/entry of data block 220A, which corresponds to database record 120C.

Reference database keys 116 may be added to index 230 under various conditions. In some cases, when a database record 120 is the first database record written to a data block 220, its database key 126 (uncompressed form) may be stored in an index entry 250 as a reference database key 116. As an example, because database record 120A is the first database record in data block 220A, reference database key 116A may be the database key 126 of database record 120A. In some cases, when writing a database record 120, if its database key 126 is sufficiently different than the most recently stored reference database key 116, then the database key 126 may be stored in an index entry 250 as a reference database key 116. A database key 126 may be sufficiently different than a reference database key 116 if the number of bytes contiguously shared from an initial start byte position within the database key 126 and the reference database key 116 does not satisfy a similarity threshold value (or alternatively, satisfies a difference threshold value). Consider an example in which a database key 126 has a value of "abbbcc" and a reference database key 116 has a value of "abcccc." The database key 126 and the reference database key 116 share two contiguous bytes ("ab") from the initial starting byte ("a"). As a result, if the similarity threshold value specifies that at least four bytes should be contiguously shared, then the database key 126 and the reference database key 116 may be considered sufficiently different since they share only two bytes. Accordingly, the database key 126 ("abbbcc") may be added to an index block 240 as a reference database key 116. In some embodiments, database server 130 may modify the similarity threshold value based on the rate at which reference database keys 116 are being added to index 230. As an example, if too many reference database keys 116 are being added to index 230 relative to the number of database records 120 being written to data extent 210, then database server 130 may decrease the similarity threshold value such that the rate at which reference database keys 116 are being added decreases. As such, the similarity threshold value may dynamically change to keep the rate at some specified/intended rate.

When searching for a database record 120 in response to a request, database server 130 may access index 230 and search for the reference database key 116 that has the closest value to the search key (identified in the request) while being less than or equal to the search key. As such, consider an example in which the search key has a value of "12345" and there are three reference database keys 116 with the values of "00123," "20123", and "12203," respectively. Database server 130 may not select the index entry 250 having the reference database key 116 with the value of "20123" because 20123 is greater than 12345 and may not select the index entry 250 having the reference database key 116 with the value of "00123" because 12203 is closer to 12345 than 00123 is. Thus, database server 130 may select the index entry 250 having the reference database key 116 with the value of "12203."

After identifying the appropriate reference database key 116, in various embodiments, database server 130 compresses the search key based on that reference database key. This may involve replacing a portion of the search key with certain data that identifies the location of the reference database key 116 and the amount of similarity between that reference database key and the search key. Once the search key has been compressed, database server 130 may then use the pointer 255 of the index entry 250 identified earlier to access the appropriate location within data extent 210. Database server 130 may begin walking through database records 120 and comparing the compressed search key with compressed database keys 136 until the correct database record 120 is located or it is determined that the correct database record 120 does not exist within data extent 210.

Figure 3A:
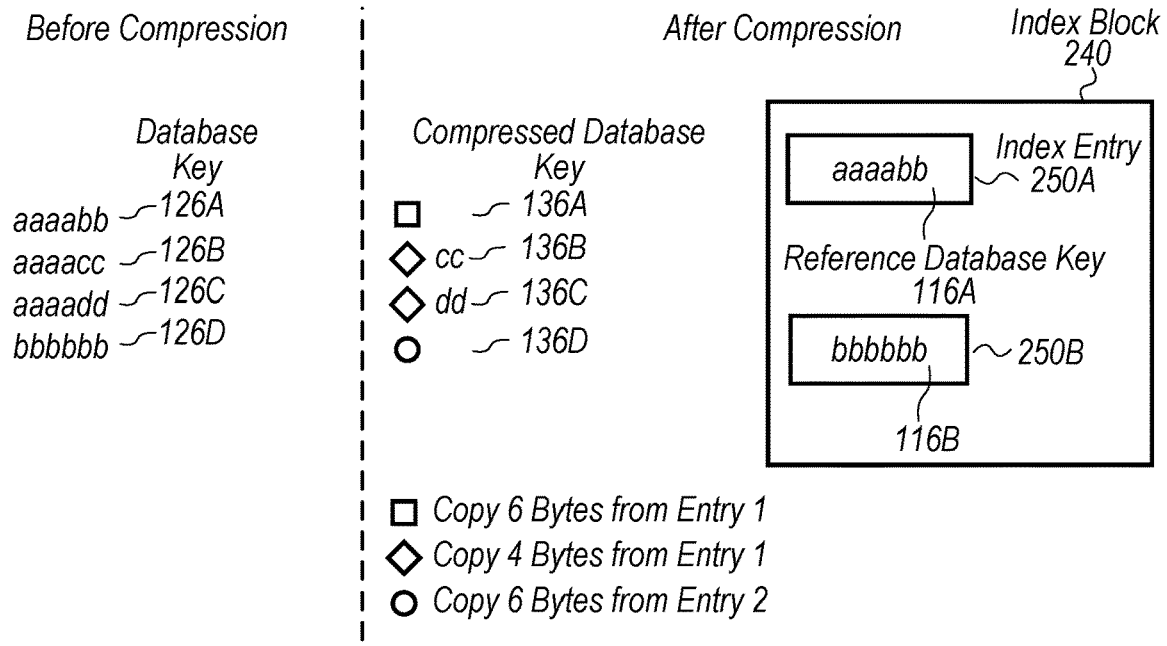
FIG. 3A is a block diagram illustrating example elements of database keys before and after compression, according to some embodiments.

Turning now to FIG. 3A, a block diagram of examples of database keys before and after compression is shown. In the illustrated embodiment, the before compression section includes database keys 126A-D and the after compression section includes compressed database keys 136A-D and an index block 240 having index entries 250A and 250B with reference database keys 116A and 116B, respectively. The before compression section and the after compression section may include different components (e.g., different database keys 126) than shown.

As explained earlier, when writing database records 120 to data blocks 220 of database 110, database server 130 may compress the database keys 126 of those database records before writing those database records to database 110. The following discussion walks through the example presented in FIG. 3A. For the example, assume that index block 240 does not initially include reference database keys 116A and 116B and that the database record 120 that includes database key 126A will be the first database record written to its data block 220.

After receiving a write request 132 for writing the particular database record 120 that includes database key 126A, database server 130 may determine whether to add database key 126A to index block 240 as a reference database key 116. Since the particular database record 120 is the initial database record written to its data block 220 (as mentioned in the assumption for the illustrated example), database server 130 adds database key 126A to index entry 250A of index block 240. Database server 130 may thereafter compress database key 126A based on reference database key 116A (itself) by replacing database key 126A with data identifying a location of reference database key 116A and an amount of similarity between database key 126A and reference database key 116A.

In various embodiments, the data that replaces a portion or all of a given database key 126 comprises three portions. The first portion may specify the particular index block 240 that includes the appropriate reference database key 116. In some cases, the first portion may be 10 bits that allow for one index block out of a maximum of 1023 different index blocks 240 to be identified. The second portion may specify an index entry 250 within the particular index block 240 identified by the first portion. In some cases, the second portion may be 12 bits that allow for one index entry out of a maximum of 4095 different index entries 250 to be identified. The third portion may specify a number of bytes that are contiguously shared from a particular byte position within the database key 126 and the corresponding reference database key 116. As an example, database key 126A shares six bytes with reference database key 116A while database key 126B shares four contiguous bytes with reference database key 116A—i.e., database key 126B and reference database key 116A share "aaaa" between their values. As another example, a database key 126 having a value of "aabbbb" may be considered to share only two bytes with reference database key 116A because from the first byte "a" of that database key, there is only one other byte that is contiguous from that first byte and common between that database key and reference database key 116A, namely the second "a" of the keys. In some cases, the third portion may be 10 bits that allow for a value (that may be indicative of a number of contiguous shared bytes or characters) between 0 and 1023 to be identified. The third portion may specify a number for something other than bytes. For example, the third portion may specify a number of contiguous shared bits. In various embodiments, the portion of a database key 126 replaced with the data (which may include the three above portions) corresponds to those bytes that are contiguously shared between that database key and the corresponding reference database key 116.

As previously mentioned, compressed database keys 136 may maintain the key-sorted order of their uncompressed versions. This results, in part, because the data (which replaces a portion or all of a database key 126 during compression) is monotonically increasing. That is, each of the three portions described above increases for each subsequently added database key 126. In particular, when a database key 126 is being compressed, it may be compressed based on the most recently added reference database key 116. Reference database keys 116 may be added over time as a range of database keys 126 are compressed. As reference database keys 116 are added and as a range of database keys 126 are compressed, subsequent database keys 126 within the range may correspond to later added reference database keys 116 and thus later added index blocks 240. As a result, the first portion of the data for a subsequent database key 126 may identify a logically greater number (corresponding to a more recently allocated index block 240) than the first portion of a prior database key 126. As such, the first portion may be monotonically increasing. Likewise, the second portion of the data for a subsequent database key 126 may identify a logically greater number (corresponding to a greater index entry 250) than a prior database key 126. Thus, the second portion may be monotonically increasing. As previously explained, the third portion may identify the number of bytes contiguously shared between a database key 126 and a reference database key 116. But as a range of database keys 126 are compressed using a particular reference database key 116, the number of byes that are contiguously shared may decrease as database server 130 traverses through the range. Thus, the third portion may identify a decreasing value. In order to cause the third portion to identify an increasing value, the value may be logically inverted. Consider an example in which a logically first database key 126 shares two bytes (represented by the bit value "10") with a reference database key 116 and a logically second database key 126 shares one byte (represented by the bit value "01"). Database server 130 may invert the bit values such that the first database key 126 is represented by the bit value "01" and the second database key is represented by the bit value "10." In some embodiments, database server 130 may store the difference between a defined maximum number of possible shared bytes and the actual number of shared bytes. For example, in one implementation, a database key 126 may potentially share 15 bytes (which may be represented by 1111) with a reference database key 116. Accordingly, if a particular database key 126 shares 10 bytes (which may be represented by 1010), database server 130 may store the value of 5 for the third portion—the difference between the maximum value of 15 and the actual value of 10. As such, as the number of shared bytes decreases, the value indicated by the third portion may keep increasing. Because the three portions increase as database records 120 are written to database 110, compressed database keys 136 may maintain key-sorted order as latter compressed database keys 136 have greater values.

After receiving a write request 132 for writing the particular database record 120 that includes database key 126B, database server 130 may determine whether to add database key 126B to index block 240 as a reference database key 116. Consequently, database server 130 may retrieve the last reference database key 116 added to index 230. In this example, database server 130 may retrieve reference database key 116A. Database server 130 may then compare database key 126B with reference database key 116A to determine an amount of similarity that exists between those database keys. As such, database server 130 may determine that database key 126B and reference database key 116A share four contiguous bytes or characters ("aaaa") between them. If the similarity threshold value indicates two bytes for example, then database key 126B may not be added as a reference database key 116 since it shares four bytes. Database server 130 may compress database key 126B by replacing the four bytes with data identifying index entry 250A of index block 240 and that four bytes are contiguously shared with reference database key 116A. As illustrated, the replaced portion of database key 126B is replaced with information (represented by a diamond shape) that indicates that four bytes are shared with the reference database key 116 in the first entry of index block 240.

Database key 126C may be compressed in a similar manner. Since database key 126C corresponds to the same reference database key 116 as database key 126B and shares the same number of contiguous bytes with that reference database key 116 as database key 126B, the replaced portion of database key 126C may be replaced with the same information as database key 126B.

After receiving a write request 132 for writing the particular database record 120 that includes database key 126D, database server 130 may determine whether to add database key 126D to index block 240 as a reference database key 116. Accordingly, database server 130 may compare database key 126D with reference database key 116A. Database server 130 may determine that database key 126D does not share any contiguous bytes with reference database key 116A. As such, their similarity (no bytes) does not satisfy the similarity threshold value of two bytes mentioned earlier. As a result, database server 130 may then add database key 126D to index block 240 as a reference database key 116B in an index entry 250B. Database server 130 may thereafter compress database key 126D based on reference database key 116B.

Figure 3B:
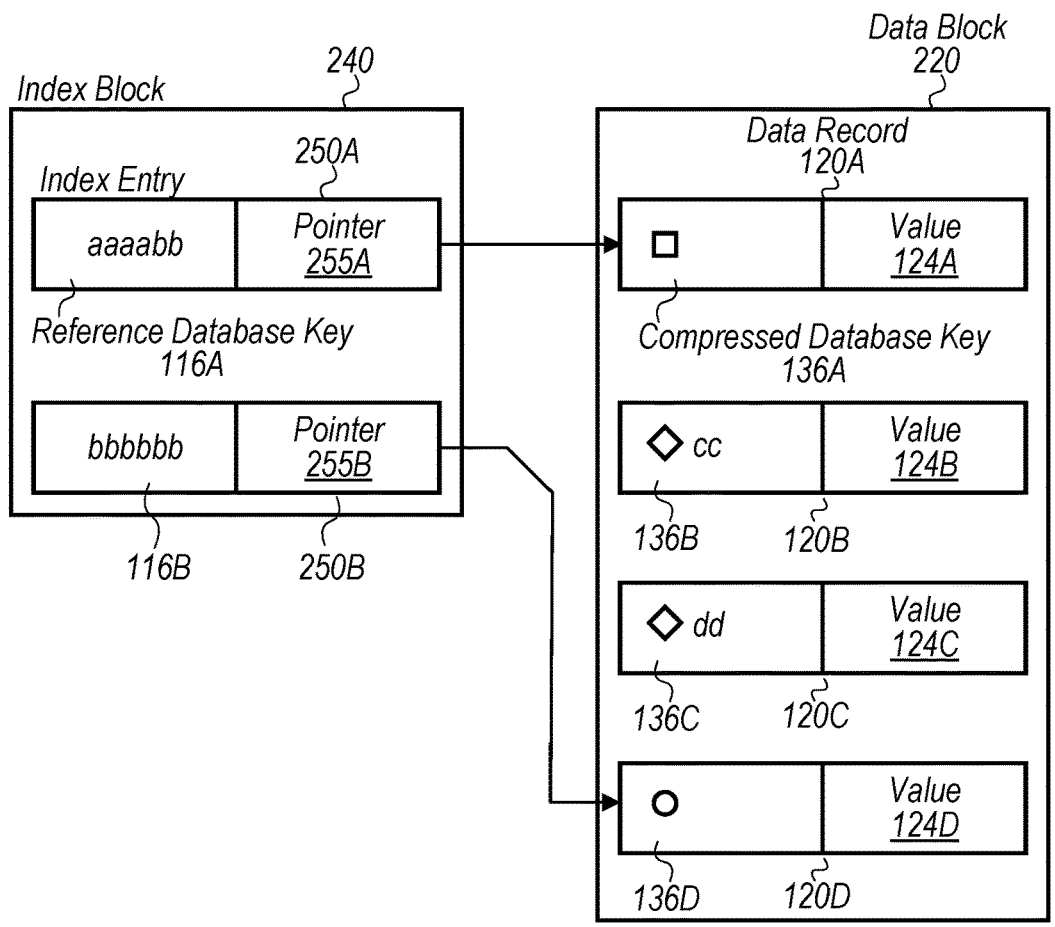
FIG. 3B is a block diagram illustrating example elements of compressed database keys, according to some embodiments.

Turning now to FIG. 3B, a block diagram of an example of a layout of a data block 220 and an index block 240 after the database key compression of FIG. 3A is shown. As illustrated, data block 220 includes database records 120A-D having compressed database keys 136A-D and values 124A-D, respectively. As further illustrated, index block 240 includes two index entries 250A and 250B having reference database keys 116A and 116B and pointers 255A and 255B, respectively.

When performing a search, database server 130 may compress the particular database key 126 being used in the search (referred to as the "search key"). Accordingly, database server 130 may search index block 240 for the reference database key 116 that has the closest value to the search key while being less than or equal to the search key. For example, database server 130 may receive a search key with a value of "aaaadd." Accordingly, database server 130 may select reference database key 116A instead of reference database key 116B. Database server 130 may then compress the search key based on reference database key 116A in order to derive a compressed search key. Thereafter, database server 130 may access a set of database records 120 using pointer 255A. Database server 130 may traverse the set of database records 120 and determine whether any of the compressed database keys 136 of those database records matches the compressed search key. If a match is determined, database server 130 may then return the identified database record 120 to the requestor; otherwise, database server 130 may notify the requestor that no matching database record 120 could be found. In some cases, database server 130 may decompress the compressed database key 136 of the identified database record 120 before returning that database record.

Figure 4:
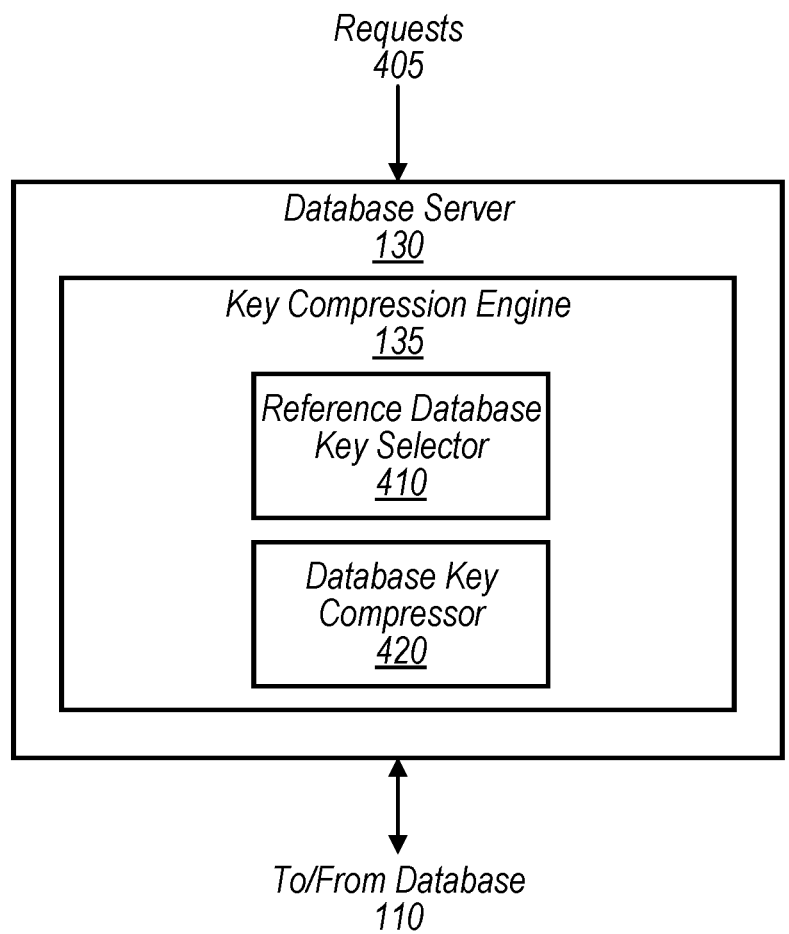
FIG. 4 is a block diagram illustrating example elements of a database server capable of compressing database keys, according to some embodiments.

Turning now to FIG. 4, a block diagram of an example database server 130 is shown. In the illustrated embodiment, database server 130 includes a reference database key selector 410 and a database key compressor 420. In some embodiments, database server 130 may be implemented differently than shown. For example, database server 130 may include a search component that performs searches for database records as previously described.

Database server 130 may receive requests 405 from a requestor such as an application server. Requests 405 may include a write request 132 or a search request that includes a search key. In order to process requests 405, database server 130 may implement reference database key selector 410 and database key compressor 420 in order to compress database keys 126 and to decompress compressed database keys 136.

Reference database key selector 410, in various embodiments, selects the appropriate reference database key 116 to be used when compressing a database key 126 or decompressing a compressed database key 136. When compressing a given database key 126 as part of writing a database record 120 to a data block 220, reference database key selector 410 may access the reference database key 116 that was most recently added to index 230. Reference database key selector 410 may then determine an amount of similarity between the given database key 126 and the most recently added reference database key 116. If the amount of similarity satisfies a similarity threshold value, then reference database key selector 410 may provide database key compressor 420 with the most recently added reference database key 116. But if the amount of similarity does not satisfy the similarity threshold value, then reference database key selector 410 may provide database key compressor 420 with the given database key 126. In such cases, reference database key selector 410 may store the given database key 126 as a new reference database key 116. When compressing a search key for a search, reference database key selector 410 may select the reference database key 116 that has the closest value to the search key while being less than or equal to the search key and then may provide database key compressor 420 with that reference database key 116. When decompressing a given compressed database key 136, reference database key selector 410 may use the data of the given compressed database key 136 to select the reference database key 116 identified by that data. Reference database key selector 410 may then provide database key compressor 420 with the selected reference database key 116.

Database key compressor 420, in various embodiments, compresses database keys 126 and decompresses compressed database keys 136. In various embodiments, when compressing a database key 126 based on a reference database key 116 selected by reference database key selector 410, database key compressor 420 replaces a portion of the database key 126 with data that identifies a location the selected reference database key 116 and an amount of similarity between the database key 126 and the reference database key 116. In various embodiments, when decompressing a compressed database key 136, database key compressor 420 may replace the appropriate data of the compressed database key 136 with the bytes that were contiguously shared between the uncompressed version of that compressed database key 136 and the reference database key 116 provided by reference database key selector 410.

Figure 5:
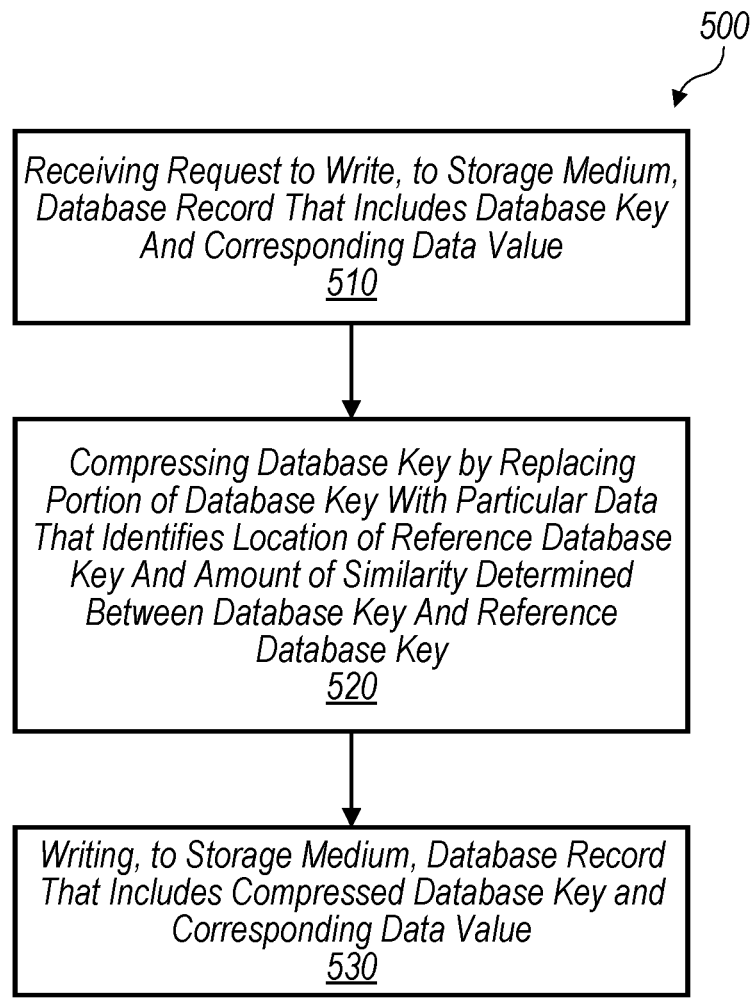
FIGS. 5 and 6 are flow diagrams illustrating example methods relating to compressing database keys, according to some embodiments.

Turning now to FIG. 5, a flow diagram of a method 500 is shown. Method 500 is one embodiment of a method performed by a computer system (e.g., database server 130) to write, to a storage medium, a database record (e.g., database record 120) that includes a compressed database key (e.g., compressed database key 136). Method 500 may include additional steps not shown. For example, the computer system may perform a search for a database record that includes a compressed database key.

Method 500 begins in step 510 with the computer system receiving a request (e.g., write request 132 or a request 405) to write a database record to a storage medium. In various cases, the database record may include a database key (e.g., database key 126) and a corresponding data value (e.g., value 124). For example, the computer system may receive a request to update a particular row of data within a database table.

In step 520, the computer system compresses the database key by replacing a portion of the database key with particular data that identifies a location of a reference database key (e.g., reference database key 116) and an amount of similarity determined between the database key and the reference database key. In some embodiments, the database reference database key is stored in one of a plurality of index blocks (e.g., index block 240) that comprise an index (e.g., index 230) associated with the data block. The computer system may maintain a plurality of reference database keys including the reference database key, where a given reference database key may be usable for compressing a plurality of database keys. The computer system may select, from the plurality of reference database keys, the reference database key for compressing based on the reference database key being the most recently added reference database key to the plurality of reference database keys.

The particular data may include, for the identified location, a first portion that specifies the index block and a second portion that specifies an entry (e.g., entry 250A) within the index block that stores the reference database key. In various embodiments, the computer system determines the amount of similarity between the database key and the reference database key based on an amount of bytes that are contiguously shared from an initial byte position within the database key and the reference database key. Accordingly, the particular data may include a third portion that is indicative of the amount of shared bytes.

In step 530, the computer system writes the database record to the storage medium. The database record may include the compressed database key (e.g., compressed database key 136) and the corresponding data value. In some cases, the database record may be included in a group of database records written to the storage medium. The database keys of that group of database records may have a particular database key-sorted order. The compressed versions of the database keys may also have the same particular database key-sorted order.

The computer system may add a reference database key to the plurality of maintained reference database keys. In some cases, in response to determining that a particular database record is the logical first database record in a set of database records for a data block (that is, the database record is the first one written to the data block), the computer system may add a database key of the particular database record to the plurality of reference database keys. The added database key may serve as a reference database key. In some cases, the computer system may compare a particular database key to a particular reference database key to determine an amount of similarity between the particular database key and the particular reference database key. In response to determining that the amount of similarity between the particular database key and the particular reference database key does not satisfy a similarity threshold value (e.g., the keys do not share more than 20% of the same contiguous bytes), the computer system may add the particular database key to the plurality of reference database keys. Alternatively, the computer system may add the particular database key in response to the amount of similarity satisfying a difference threshold value (e.g., the keys are 80% different). In some instances, the computer system may modify the similarity threshold value (e.g., 20% to 10%) based on a rate at which database keys are being added to the plurality of reference database keys.

The computer system may compress a second database key by replacing a portion of the second database key with second particular data that identifies a location of the reference database key and an amount of similarity that is determined between the second database key and the reference database key. In some cases, the particular data of the database key and the second particular data of the second database key may indicate different amounts of similarity. The same reference database key, however, may be used to compress multiple database keys.

Figure 6:
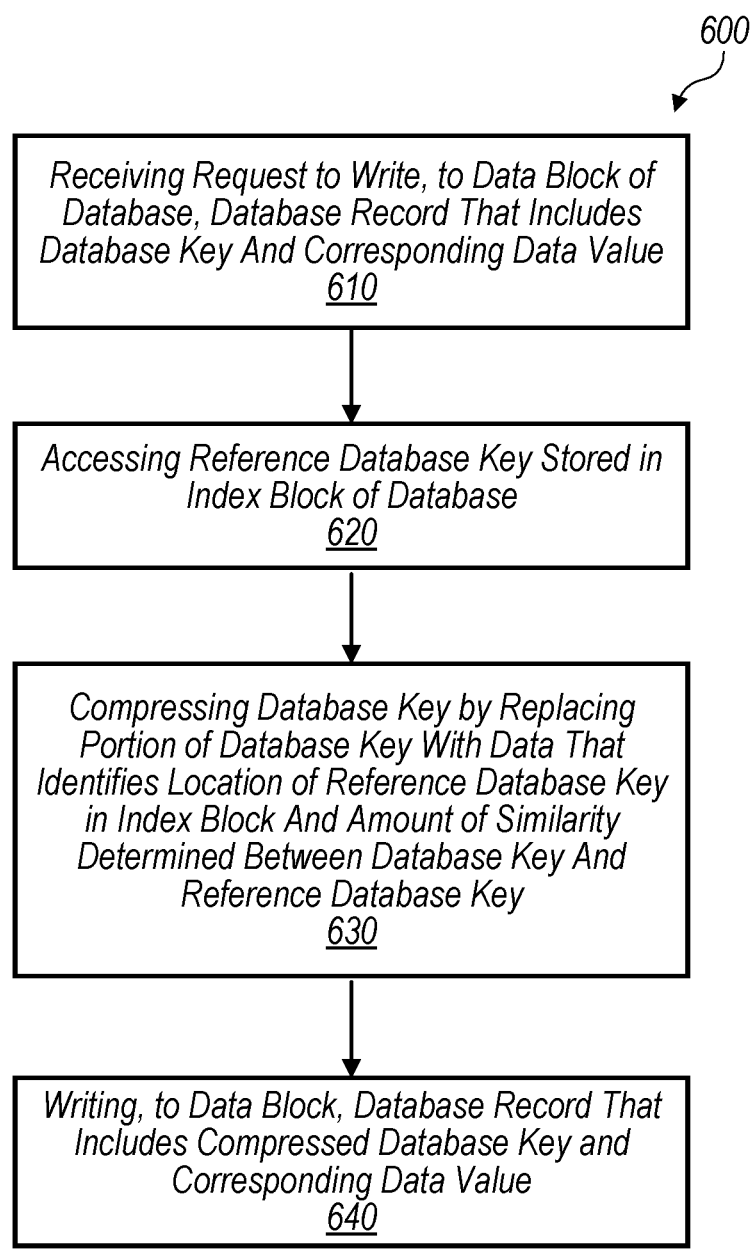

Turning now to FIG. 6, a flow diagram of a method 600 is shown. Method 600 is one embodiment of a method performed by a computer system (e.g., database server 130) to write, to a database (e.g., database 110), a database record (e.g., database record 120) that includes a compressed database key (e.g., compressed database key 136). Method 600 may be performed by executing a set of program instructions that is stored on a non-transitory computer-readable medium. Method 500 may include additional steps not shown. For example, the computer system may perform a search for a database record that includes a compressed database key.

Method 600 begins in step 610 with the computer system receiving a request (e.g., write request 132 or request 405) to write a database record to a data block (e.g., data block 220) of a database. In various cases, the database record may include a database key (e.g., database key 126) and a corresponding data value (e.g., value 124). In step 620, the computer system accesses a reference database key (e.g., reference database key 116) stored in an index block (e.g., index block 240) of the database.

In step 630, the computer system compresses the database key by replacing a portion of the database key with data that identifies a location of the reference database key in the index block and an amount of similarity determined between the database key and the reference database key. Determining the amount of similarity may include determining a number of characters that are contiguously shared between the database key and the reference database key from an initial character position. The number of characters may be identified by a set of bits. The computer system may invert each bit in the set of bits (e.g., 1001->0110). As such, the data may specify a value identified by the set of inverted bits.

In step 640, the computer system writes the database record to the data block. In various cases, the database record may include the compressed database key and the corresponding data value. Decompressing the compressed database key may include accessing the reference database key from the location identified by the data of the compressed database key; and replacing the data with a portion of the reference database key that is identified based on the amount of similarity.

Figure 7:
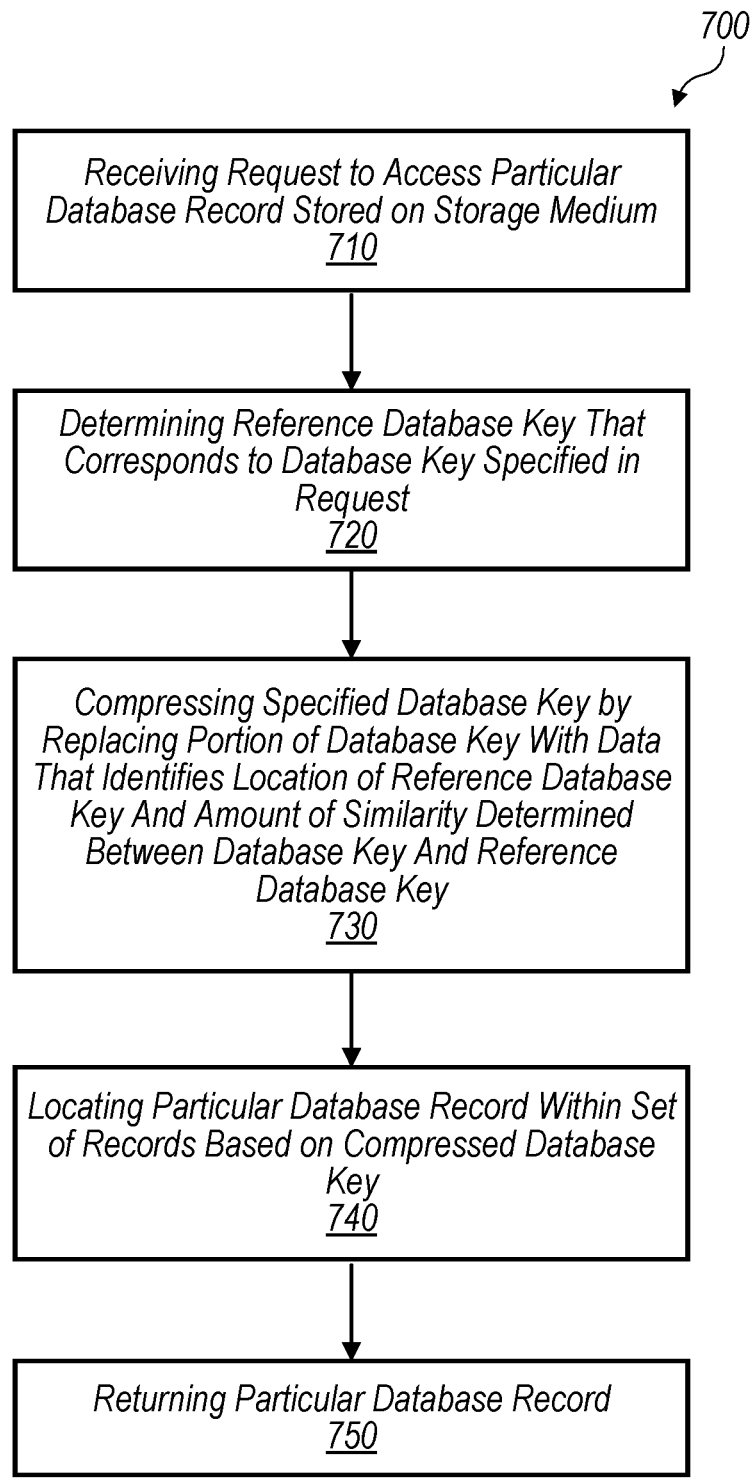
FIG. 7 is a flow diagram illustrating example methods relating to performing a search for a database record, according to some embodiments.

Turning now to FIG. 7, a flow diagram of a method 700 is shown. Method 700 is one embodiment of a method performed by a computer system (e.g., database server 130) in order to perform a search for a particular database record (e.g., database record 120). Method 700 may include additional steps not shown. For example, the computer system may write the particular database record to a file of a particular level of a log-structured merge-tree (LSM tree).

Method 700 begins in step 710 with the computer system receiving a request (e.g., a request 405) to access a particular database record stored on a storage medium. The request may specify a database key (e.g., database key 126) that is usable to access the particular database record.

In step 720, the computer system determines a reference database key (e.g., reference database key 116) that corresponds to the database key specified in the request. The computer system, in some embodiments, maintains a plurality of reference database keys that include the reference database key. Accordingly, the reference database key may be determined from the plurality of database key based on the reference database key having a greater amount of similarity to the database key than the other ones of the plurality of reference database keys to the database key.

In step 730, the computer system compresses the specified database key by replacing a portion of the database key with data that identifies a location of the reference database key and an amount of similarity determined between the database key and the reference database key.

In step 740, the computer system locates the particular database record within a set of records based on the compressed database key (e.g., compressed database key 136). The computer system may locate the particular database record by accessing, using pointer information associated with the reference database key, a data block that stores a plurality of database records that include the particular database record and by comparing the compressed database key with a plurality of compressed database keys corresponding to the plurality of database records. In step 750, the computer system returns the particular database record.

Exemplary Computer System

Figure 8:
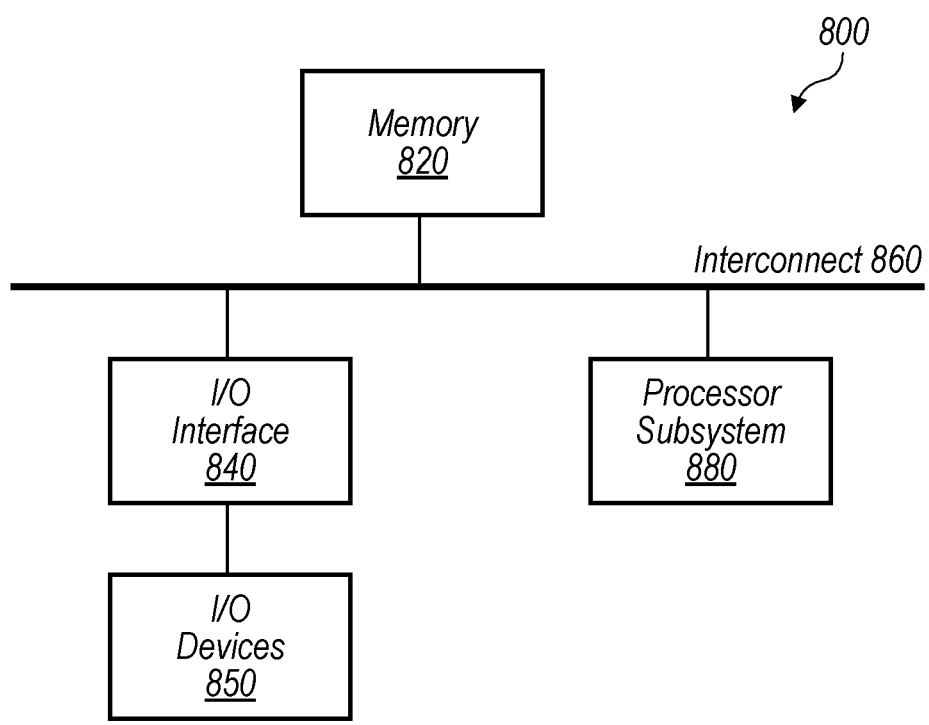
FIG. 8 is a block diagram illustrating an example computer system, according to some embodiments.

Turning now to FIG. 8, a block diagram of an exemplary computer system 800, which may implement database 110 and/or database server 130, is depicted. Computer system 800 includes a processor subsystem 880 that is coupled to a system memory 820 and I/O interfaces(s) 840 via an interconnect 860 (e.g., a system bus). I/O interface(s) 840 is coupled to one or more I/O devices 850. Computer system 800 may be any of various types of devices, including, but not limited to, a server system, personal computer system, desktop computer, laptop or notebook computer, mainframe computer system, tablet computer, handheld computer, workstation, network computer, a consumer device such as a mobile phone, music player, or personal data assistant (PDA). Although a single computer system 800 is shown in FIG. 8 for convenience, system 800 may also be implemented as two or more computer systems operating together.

Processor subsystem 880 may include one or more processors or processing units. In various embodiments of computer system 800, multiple instances of processor subsystem 880 may be coupled to interconnect 860. In various embodiments, processor subsystem 880 (or each processor unit within 880) may contain a cache or other form of on-board memory.

System memory 820 is usable store program instructions executable by processor subsystem 880 to cause system 800 perform various operations described herein. System memory 820 may be implemented using different physical memory media, such as hard disk storage, floppy disk storage, removable disk storage, flash memory, random access memory (RAM-SRAM, EDO RAM, SDRAM, DDR SDRAM, RAMBUS RAM, etc.), read only memory (PROM, EEPROM, etc.), and so on. Memory in computer system 800 is not limited to primary storage such as memory 820. Rather, computer system 800 may also include other forms of storage such as cache memory in processor subsystem 880 and secondary storage on I/O Devices 850 (e.g., a hard drive, storage array, etc.). In some embodiments, these other forms of storage may also store program instructions executable by processor subsystem 880. In some embodiments, program instructions that when executed implement database 110, database server 130, reference database key selector 410, and/or database key compressor 420 may be included/stored within system memory 820.

I/O interfaces 840 may be any of various types of interfaces configured to couple to and communicate with other devices, according to various embodiments. In one embodiment, I/O interface 840 is a bridge chip (e.g., Southbridge) from a front-side to one or more back-side buses. I/O interfaces 840 may be coupled to one or more I/O devices 850 via one or more corresponding buses or other interfaces. Examples of I/O devices 850 include storage devices (hard drive, optical drive, removable flash drive, storage array, SAN, or their associated controller), network interface devices (e.g., to a local or wide-area network), or other devices (e.g., graphics, user interface devices, etc.). In one embodiment, computer system 800 is coupled to a network via a network interface device 850 (e.g., configured to communicate over WiFi, Bluetooth, Ethernet, etc.).

Although specific embodiments have been described above, these embodiments are not intended to limit the scope of the present disclosure, even where only a single embodiment is described with respect to a particular feature. Examples of features provided in the disclosure are intended to be illustrative rather than restrictive unless stated otherwise. The above description is intended to cover such alternatives, modifications, and equivalents as would be apparent to a person skilled in the art having the benefit of this disclosure.

The scope of the present disclosure includes any feature or combination of features disclosed herein (either explicitly or implicitly), or any generalization thereof, whether or not it mitigates any or all of the problems addressed herein. Accordingly, new claims may be formulated during prosecution of this application (or an application claiming priority thereto) to any such combination of features. In particular, with reference to the appended claims, features from dependent claims may be combined with those of the independent claims and features from respective independent claims may be combined in any appropriate manner and not merely in the specific combinations enumerated in the appended claims.

What is claimed is:

1. A method, comprising:
   receiving a request for a database record stored on a storage medium, wherein the database record includes a compressed database key having information that specifies:
   a location of a reference database key; and
   an amount of similarity between the reference database key and an uncompressed version of the compressed database key;
   accessing the reference database key based on the location specified by the compressed database key;
   decompressing the compressed database key based on the reference database key and the amount of similarity; and
   returning the database record with the decompressed database key.

2. The method of claim 1, wherein the database record is written to a data block that stores a set of database records, and wherein the reference database key is stored in one of a plurality of index blocks that comprise an index associated with the data block.

3. The method of claim 2, wherein the information includes a first portion that specifies the index block and a second portion that specifies an entry within the index block that stores the reference database key.

4. The method of claim 1, wherein the amount of similarity indicates an amount of bytes that are contiguously shared, starting from an initial byte position, between the reference database key and the uncompressed version of the compressed database key.

5. The method of claim 1, further comprising:
   compressing the uncompressed version of the compressed database key, including:
   based on determining that the database record is the logical first database record in a set of database records, adding the reference database key to a set of reference database keys that is maintained by a computer system that performs the method.

6. The method of claim 1, wherein an uncompressed version of another database key shares a different amount of similarity with the reference database key than the uncompressed version of the compressed database key.

7. The method of claim 1, wherein the database record is included in a set of database records having database keys that define a particular database key-sorted order, and wherein compressed versions of the database keys defined the same particular database key-sorted order.

8. A non-transitory computer readable medium having program instructions stored thereon that are capable of causing a computer system to perform operations comprising:
   receiving a request for a database record stored on a storage medium, wherein the database record includes a compressed database key having information that specifies:
   a location of a reference database key; and
   an amount of similarity between the reference database key and an uncompressed version of the compressed database key;
   accessing the reference database key based on the location specified by the compressed database key;
   decompressing the compressed database key based on the reference database key and the amount of similarity; and
   returning the database record with the decompressed database key.

9. The medium of claim 8, wherein the operations further comprise:
   writing the database record to a data block that stores a set of database records; and
   writing the reference database key to one of a plurality of index blocks that define an index associated with the data block.

10. The medium of claim 9, wherein the information includes a first portion that specifies the index block and a second portion that specifies an entry within the index block that stores the reference database key.

11. The medium of claim 8, wherein the amount of similarity indicates a number of characters that are contiguously shared, from an initial character position, between the reference database key and the uncompressed version of the compressed database key.

12. The medium of claim 8, wherein the operations further comprise:
   receiving a request to store the database record on the storage medium;
   compressing the uncompressed version of the database key by replacing a portion of the database key with data that identifies the location of the reference database key and the amount of similarity; and
   storing the database record with the compressed database key.

13. The medium of claim 8, wherein the database record is written to a file of a particular level of a log-structured merge-tree (LSM tree), wherein the LSM tree includes multiple levels storing files, and wherein the reference database key is specific to the particular level.

14. The medium of claim 8, wherein the operations further comprise:
receiving a request for a different database record;
accessing the reference database key;
decompressing a database key of the different record based on the reference database key and a different amount of similarity; and
returning the different database record.

15. A system, comprising:
at least one processor; and
memory having program instructions stored thereon that are executable by the at least one processor to cause the system to perform operations comprising:
receiving a request for a database record stored on a storage medium, wherein the database record includes a compressed database key having information that specifies:
a location of a reference database key; and
an amount of similarity between the reference database key and an uncompressed version of the compressed database key;
accessing the reference database key based on the location specified by the compressed database key;
decompressing the compressed database key based on the reference database key and the amount of similarity; and
returning the database record with the decompressed database key.

16. The system of claim 15, wherein the operations further comprise:
writing the database record to a data block and the reference database key to an index block that is separate from the data block.

17. The system of claim 16, wherein the operations further comprise:
prior to receiving the request, compressing the uncompressed version of the database key based on the reference database key, wherein the compressing includes replacing a portion of the database key with a first portion that specifies the index block and a second portion that specifies an entry within the index block that stores the reference database key.

18. The system of claim 16, wherein the writing includes storing, with the reference database key, pointer information that identifies the data block that stores the database record.

19. The system of claim 15, wherein the amount of similarity indicates an amount of bytes that are contiguously shared, starting from an initial byte position, between the reference database key and the uncompressed version of the compressed database key.

20. The system of claim 15, wherein the operations further comprise:
receiving a request for a different database record;
accessing the reference database key;
decompressing a database key of the different record based on the reference database key and the amount of similarity; and
returning the different database record.

* * * * *